(12) United States Patent
Choi

(10) Patent No.: US 11,657,885 B2
(45) Date of Patent: May 23, 2023

(54) MEMORY DEVICE AND METHOD OF OPERATING THE MEMORY DEVICE

(71) Applicant: SK hynix Inc., Icheon-si Gyeonggi-do (KR)

(72) Inventor: Hyung Jin Choi, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 26 days.

(21) Appl. No.: 17/196,509

(22) Filed: Mar. 9, 2021

(65) Prior Publication Data

US 2022/0068410 A1 Mar. 3, 2022

(30) Foreign Application Priority Data

Sep. 2, 2020 (KR) .......................... 10-2020-0111857

(51) Int. Cl.
| | | |
|---|---|---|
| *G11C 7/10* | (2006.01) | |
| *G11C 16/34* | (2006.01) | |
| *G11C 16/10* | (2006.01) | |
| *G11C 16/24* | (2006.01) | |
| *G11C 16/30* | (2006.01) | |
| *G11C 16/26* | (2006.01) | |

(52) U.S. Cl.
CPC ........ *G11C 16/3459* (2013.01); *G11C 7/1039* (2013.01); *G11C 16/10* (2013.01); *G11C 16/24* (2013.01); *G11C 16/26* (2013.01); *G11C 16/30* (2013.01); *G11C 16/3404* (2013.01)

(58) Field of Classification Search
CPC .... G11C 16/3459; G11C 7/1039; G11C 16/10
See application file for complete search history.

(56) References Cited

U.S. PATENT DOCUMENTS

| | | | | |
|---|---|---|---|---|
| 2011/0255345 | A1* | 10/2011 | Dong ................. | G11C 16/3427 365/185.03 |
| 2018/0075909 | A1* | 3/2018 | Lee ......................... | G11C 7/14 |
| 2019/0088313 | A1* | 3/2019 | Kondo ................ | G11C 11/5642 |

FOREIGN PATENT DOCUMENTS

| | | |
|---|---|---|
| KR | 101010468 B1 | 1/2011 |
| KR | 1020180009580 A | 1/2018 |
| KR | 1020180029430 A | 3/2018 |

* cited by examiner

*Primary Examiner* — Mohammed A Bashar
(74) *Attorney, Agent, or Firm* — William Park & Associates Ltd.

(57) ABSTRACT

The present technology includes a memory device and a method of operating the memory device. The memory device includes a control logic circuit configured to control the peripheral circuit so that the program operation is performed. The control logic circuit controls a peripheral circuit so that memory cells to be programmed to first to (N−1)-th program states are programmed in a double program method using a main verify voltage and a sub verify voltage less than the main verify voltage during a verify operation and memory cells to be programmed to the N-th program state are programmed in a normal program method using the main verify voltage during the verify operation, when the verify operation of the memory cells corresponding to the (N−1)-th program state has failed.

16 Claims, 10 Drawing Sheets

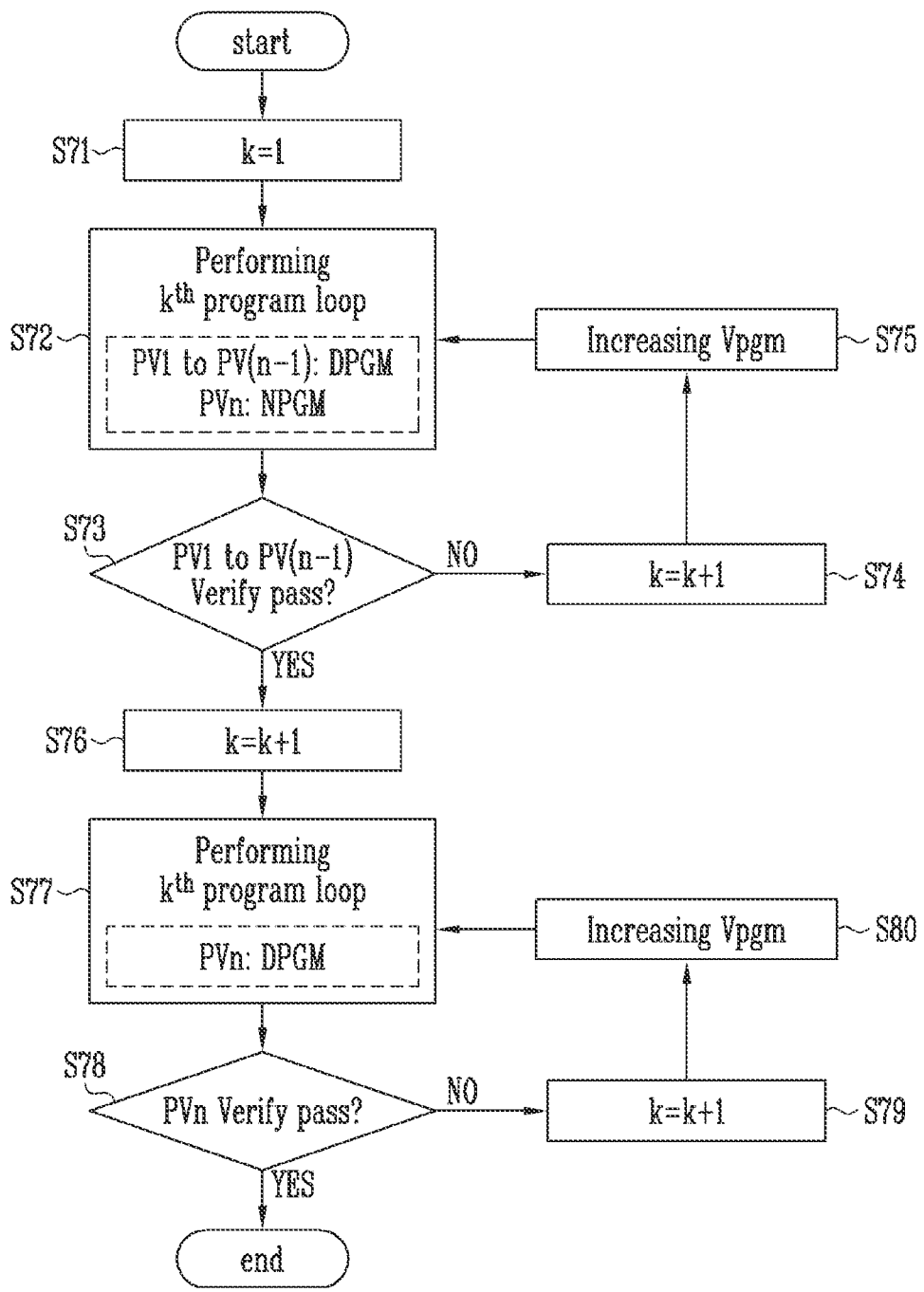

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2020-0111857, filed on Sep. 2, 2020, in the Korean intellectual Property Office, the entire disclosure of which is incorporated herein by reference.

BACKGROUND

1. Technical Field

The present disclosure relates to a memory device and a method of operating the memory device, and more particularly, to a memory device capable of performing a program operation and a method of operating the memory device.

2. Related Art

A memory device may include a volatile memory device in which stored data is destroyed when power supply is cut off, and a non-volatile memory device in which stored data is maintained even though the power supply is cut off.

The volatile memory device may include a dynamic random-access memory (DRAM) and a static random-access memory (SRAM). The non-volatile memory device may include a read only memory (ROM), a programmable read only memory (PROM), an erasable PROM (EPROM), an electrically EPROM (EEPROM), a NAND FLASH, and the like.

The memory device may include a memory cell array, peripheral circuits, and a logic circuit.

The memory cell array may include a plurality of memory cells, and the plurality of memory cells may store data. A method of storing one bit of data in one memory cell is referred to as a single level cell (SLC) method, and a method of storing two or more bits of data in one memory cell is referred to as a multi-level cell (MLC) method. A program operation of the MLC method may be classified into a triple level cell (TLC) method or a quadruple level cell (QLC) method according to the number of bits stored in the memory cell. In the TLC method, three bits of data may be stored in one memory cell, and in the QLC method, four bits of data may be stored in one memory cell.

SUMMARY

A memory device according to an embodiment of the present disclosure may include a memory block including a plurality of pages, a peripheral circuit configured to perform a program operation to program memory cells included in a page selected among the plurality of pages to first to N-th program states wherein 'N' is an integer greater than or equal to 2, and a control logic circuit configured to control the peripheral circuit so that the program operation is performed. The control logic circuit may control the peripheral circuit so that memory cells to be programmed to first to (N−1)-th program states are programmed in a double program method using a main verify voltage and a sub verify voltage less than the main verify voltage during a verify operation and memory cells to be programmed to the N-th program state are programmed with a normal program method using the main verify voltage during the verify operation, when the verify operation of the memory cells corresponding to the (N−1)-th program state is failed, and the control logic circuit may control the peripheral circuit so that the verify operation of the memory cells to be programmed to the N-th program state is performed with the double program method when the verify operation of the memory cells corresponding to the (N−1)-th program state has passed.

A method of operating a memory device according to an embodiment of the present disclosure in a program operation for programming memory cells to first to N-th program states, wherein 'N' is an integer greater than or equal to 2, may include performing a sub program operation, a sub verify operation, and a main verify operation on memory cells to be programmed to the first to (N−1)-th program states, and performing the sub program operation and the main verify operation on memory cells to be programmed to the N-th program state, and performing the sub program operation, the sub verify operation, and the main verify operation on the memory cells to be programmed to the N-th program state when the main verify operation of the memory cells to be programmed to the (N−1)-th program states has passed.

A method of operating a memory device according to an embodiment of the present disclosure may include programming memory cells to first to N-th program states according to a target voltage, and performing program loops by mixing a normal program method and a double program method until a program operation of memory cells of which the target voltage corresponds to an (N−1)-th program state is completed, wherein 'N' is an integer greater than or equal to 2, and performing the program loops in the double program method after the program operation of the memory cells of which the target voltage corresponds to the (N−1)-th program state has completed.

BRIEF DESCRIPTION OF THE DRAWINGS

FIG. 7 is a flowchart illustrating a program operation according to an embodiment of the present disclosure.

DETAILED DESCRIPTION

An embodiment of the present disclosure provides a memory device capable of improving a threshold voltage distribution of selected memory cells having the highest target voltage during a program operation, and a method of operating the memory device.

Figure 1:
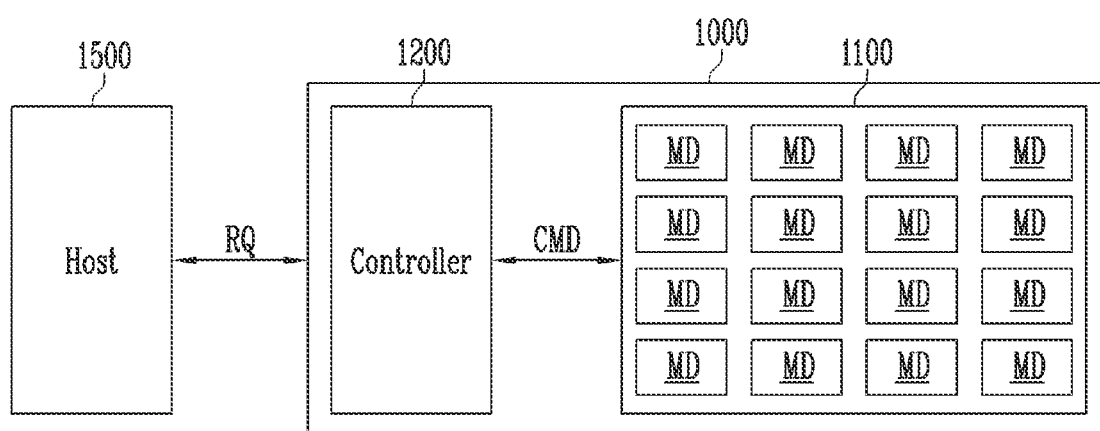
FIG. 1 is a diagram illustrating a memory system according to an embodiment of the present disclosure.

The present technology may improve a threshold voltage distribution of memory cells, and may shorten a time in which a program operation is performed, FIG. 1 is a diagram illustrating a memory system according to an embodiment of the present disclosure.

Referring to FIG. 1, the memory system 1000 may include a storage device 1100 and a controller 1200. The storage device 1100 may include a plurality of memory devices MD, and the memory devices MD may be connected to the controller 1200 through input/output lines.

The controller 1200 may communicate between a host 1500 and the memory device MD. The controller 1200 may generate a command CMD for controlling the memory devices MD according to a request RQ of the host 1500, and even though the request RQ of the host 1500 is not present, the controller 1200 may perform a background operation for improving performance of the system 1000.

The host 1500 may generate the requests RQ for various operations and may output the generated requests RQ to the memory system 1000. For example, the requests RQ may include a program request that may control a program operation, a read request that may control a read operation, an erase request that may control an erase operation, and the like.

The host 1500 may communicate with the memory system 1000 through various interfaces such as peripheral component interconnect express (PCIe), advanced technology attachment (ATA), serial ATA (SATA), parallel ATA (DATA), serial attached SCSI (SAS), non-volatile memory express (NVMe) a universal serial bus (USB), a multi-media card (MMC), an enhanced small disk interface (ESDI), or integrated drive electronics (IDE).

The memory devices MD according to the present embodiment may perform the program operation. The program operation may be performed in an incremental step pulse program (ISPP) method in which a program voltage is gradually increased. In the present embodiment, the memory devices MD may perform a program operation of the ISPP method in which a normal program method and a double program method is selectively applied or the normal program method and the double program method are selectively mixed.

The normal program method is a method of applying a program permission voltage to a selected bit line and applying a program inhibition voltage to an unselected bit line when a program voltage is applied to a selected word line. The selected word line refers to a word line to which program target memory cells are connected. The selected bit line refers to a bit line connected to a memory cell of which a threshold voltage is lower than a target voltage, and the unselected bit line refers to a bit line connected to a memory cell of which a threshold voltage is increased to be equal to or higher than the target voltage. The program permission voltage may be a voltage having a large potential difference from the program voltage applied to the selected word line, and may be, for example, 0V. The program inhibition voltage may be a voltage having a small potential difference from the program voltage, and may be, for example, a positive voltage of 18V or more.

The normal program method is a method of applying the program permission voltage to a bit line connected to memory cells having a large difference between the threshold voltage and the target voltage among the selected bit lines, applying a program decrease voltage to a bit line connected to memory cells having a small difference between the threshold voltage and the target voltage, and applying the program inhibition voltage to the unselected bit line, when the program voltage is applied to the selected word line. For convenience of description, the bit line connected to the memory cells having the large difference between the threshold voltage and the target voltage may be defined as a first state bit line, and the bit line connected to the memory cells having the relatively small difference between the threshold voltage and the target voltage may be defined as a second state bit line. The program decrease voltage may be a voltage for slowly increasing the threshold voltage of the memory cell connected to the second state bit line than the threshold voltage of the memory cell connected to the first state bit line. For example, the program decrease voltage may be set to a positive voltage between the program inhibition voltage and the program permission voltage, FIG. 2 is a diagram illustrating the memory device according to an embodiment of the present disclosure.

Figure 2:
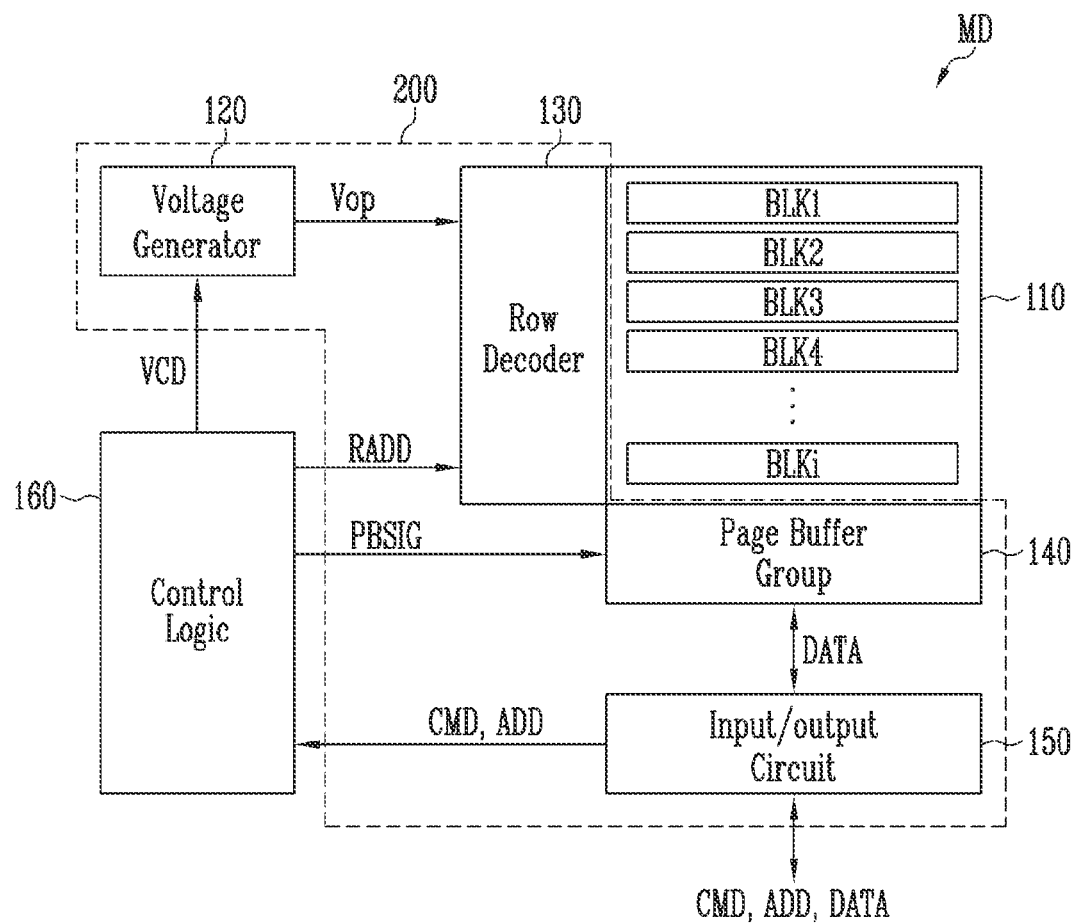
FIG. 2 is a diagram illustrating a memory device according to an embodiment of the present disclosure.

Referring to FIG. 2, the memory device MD may include a memory cell array 110 in which data is stored, a peripheral circuit 200 that performs a program, read, or erase operation, and control logic 160 that controls the peripheral circuit 200. The control logic 160 may be implemented as hardware, software, or a combination of hardware and software. For example, the control logic 160 may be a control logic circuit operating in accordance with an algorithm and/or a processor executing control logic code.

The memory cell array 110 may include a plurality of memory blocks BLK1 to BLKi in which data is stored. Each of the memory blocks BLK1 to BLKi may include a plurality of memory cells, and the memory cells may be implemented in a two-dimensional structure arranged in parallel to a substrate or a three-dimensional structure stacked in a vertical direction on the substrate.

The peripheral circuit 200 may include a voltage generator 120, a row decoder 130, a page buffer group 140, and an input/output circuit 150.

The voltage generator 120 may generate and output operation voltages Vop required for various operations in response to a voltage code VCD, For example, the voltage generator 120 may generate and output a program voltage, a verify voltage, a read voltage, a pass voltage, an erase voltage, and the like having various levels.

The row decoder 130 may select one memory block among the memory blocks BLK1 to BLKi included in the memory cell array 110 according to a row address RADD, and transmit the operation voltages Vop to the selected memory block.

The page buffer group 140 may be connected to the memory cell array 110 through bit lines. For example, the page buffer group 140 may include page buffers connected to the respective bit lines. The page buffers may operate simultaneously in response to page buffer control signals PBSIG, and may temporarily store data during the program or read operation. The verify operation performed during the program operation and the verify operation performed during the erase operation may be performed in a method the same as the read operation, During the read operation or the verify operation, the page buffers may sense a voltage of bit lines, which vary according to a threshold voltage of the memory cells, That is, it may be determined whether the threshold voltages of the memory cells are lower than or higher than the read voltage or the verify voltage according to a result of the sensing operation performed in the page buffers. During the program operation of the normal program method, the page buffers may apply the program permission voltage to the selected bit lines and apply the program inhibition voltage to the unselected bit lines. During the program operation of the double program method, the page buffers may apply the program permission voltage to the first state bit lines, apply the program decrease voltage to the second state bit lines, and apply the program inhibition voltage to the unselected bit lines.

The input/output circuit 150 may be connected to the controller 1200 of FIG. 1 through input/output lines. The input/output circuit 150 may input/output a command CMD, an address ADD, and data DATA through the input/output lines. For example, the input/output circuit 150 may transmit the command CMD and the address ADD received through the input/output lines to the control logic 160, and transmit the data DATA received through the input/output lines to the page buffer group 140. The input/output circuit 150 may output the data DATA received from the page buffer group 140 to the controller 1200 through the input/output lines.

The control logic 160 may output the voltage code VCD, the row address RADD, the page buffer control signals PBSIG, and a column address CADD in response to the command CMD and the address ADD, For example, the control logic 160 may include software that performs an algorithm in response to the command CMD, and hardware configured to output various signals according to the address ADD and the algorithm.

The control logic 160 may control the peripheral circuit 200 by selectively applying the normal program method and the double program method according to a result of the verify operation during the program operation of a selected page among a plurality of pages included in a selected memory block.

Figure 3:
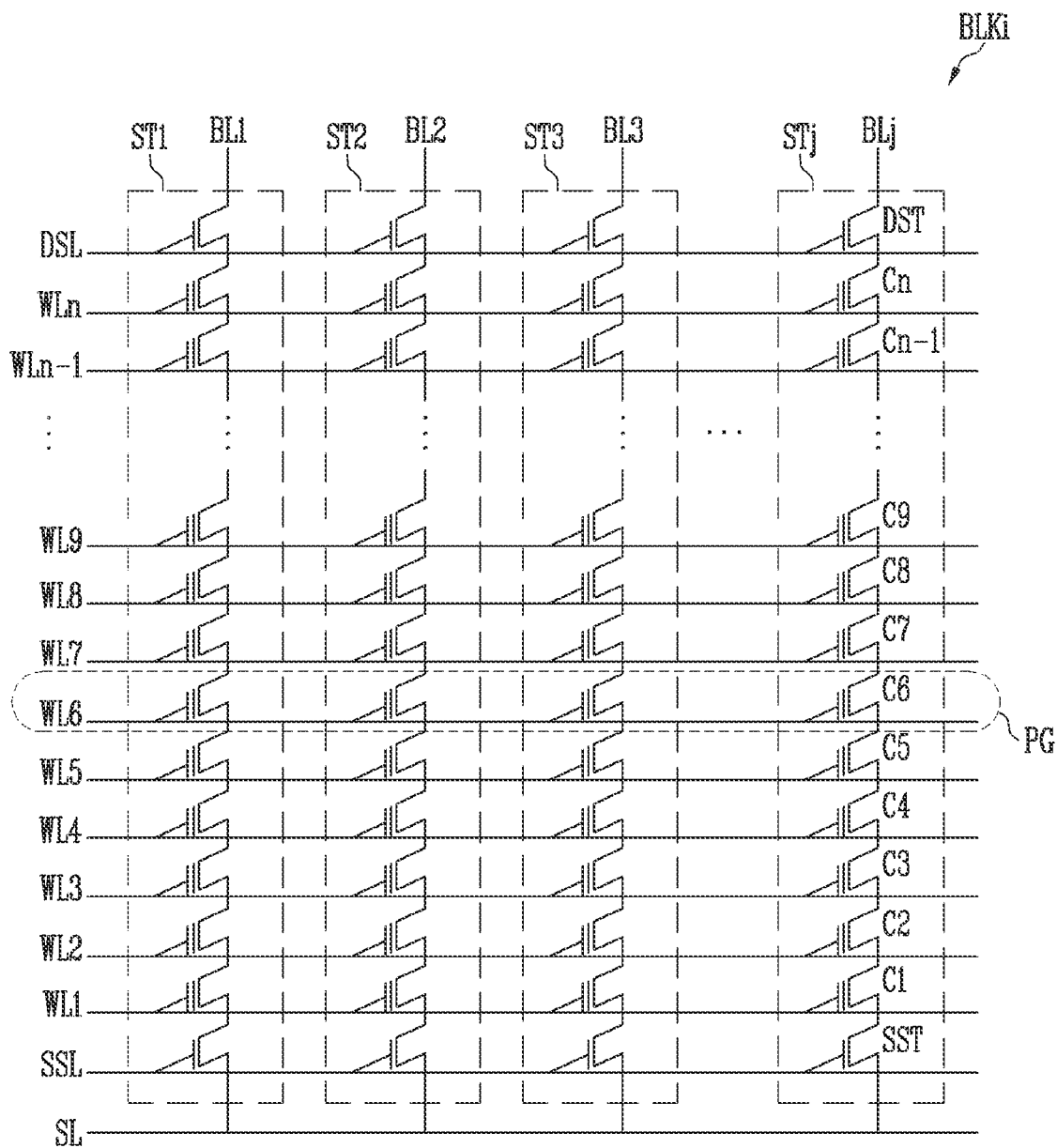
FIG. 3 is a diagram illustrating a memory block according to an embodiment of the present disclosure.

FIG. 3 is a diagram illustrating the memory block according to an embodiment of the present disclosure, and an i-th memory block BLKi is shown as an example among the plurality of memory blocks BLK1 to BLKi shown in FIG. 2.

Referring to FIG. 3, the i-th memory block BLKi may include a plurality of strings ST1 to STj (j is a positive integer). The first to j-th strings ST1 to STj may be connected between bit lines BL1 to BLj and a source line SL, For example, the first string ST1 may be connected between the first bit line BL1 and the source line SL, the second string ST2 may be connected between the second bit line BL2 and the source line SL, and the j-th string STj may be connected between the j-th bit line BLj and the source line SL.

Each of the first to j-th strings ST1 to STj may include a source select transistor SST, a plurality of memory cells C1 to Cn, and a drain select transistor DST. Although not shown in the drawing, dummy cells may be further included between the memory cells C1 to Cn and the source or drain select transistors SST or DST. A configuration of the string is specifically described as follows using the j-th string STj as an example.

The source select transistor SST included in the j-th string STj may electrically connect or disconnect between the source line SL and the first memory cell C1 according to a voltage applied to the source select line SSL. Gates of the first to n-th memory cells C1 to Cn may be connected to first to n-th word lines WL1 to WLn, respectively. The drain select transistor DST may electrically connect or disconnect between the j-th bit line BLj and the n-th memory cell Cn according to a voltage applied to the drain select line DSL. Gates of the source select transistors SST included in the different strings ST1 to STj may be commonly connected to the source select line SSL, and gates of the first to n-th memory cells C1 to Cn may be connected to the first to n-th word lines WL1 to WLn, and gates of the drain select transistors DST may be commonly connected to the drain select line DSL. A group of memory cells connected to the same word line is referred to as a page (PG), and program and read operations may be performed in a unit of the page PG.

The program operation according to the present embodiment may be performed in an incremental step pulse program (ISPP) method in which the program voltage is gradually increased. In the program operation of the ISPP method, a plurality of program loops may be performed until the threshold voltage of the selected memory cells increases to the target voltage, and the program voltage may be gradually increased each time the program loop is performed. In each of the program loops, a sub program operation for increasing the threshold voltage of the selected memory cells and a verify operation for determining whether the threshold voltage of the selected memory cells is increased to the target voltage may be performed. In the sub program operation, the program voltage may be applied to the selected word line, and in the verify operation, the verify voltage may be applied to the selected word line. Whether the verify operation is passed or failed according to data of the memory cells sensed in the verify operation may be performed in the sub program operation of a next program loop. The operation of determining whether the verify operation is passed or failed during the sub program operation may be a current sensing check operation.

Figure 4:
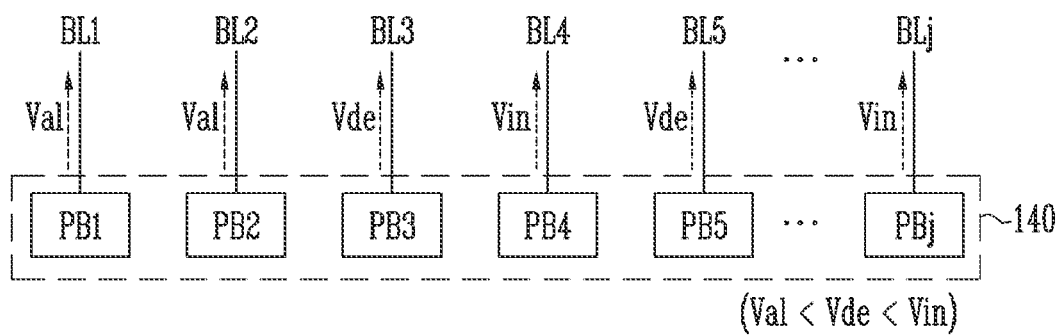
FIG. 4 is a diagram illustrating voltages applied to bit lines according to an embodiment of the present disclosure.

FIG. 4 is a diagram illustrating voltages applied to the bit lines according to an embodiment of the present disclosure.

Referring to FIG. 4, the page buffer group 140 may include first to j-th page buffers PB1 to PBj. The first to j-th page buffers PB1 to PBj may be connected to the first to j-th bit lines BL1 to BLj, respectively. When the program operation starts, the first to j-th page buffers PB1 to PBj may store data output from the controller 1200 of FIG. 1, and may apply a program permission voltage Val, a program decrease voltage Vde, or a program inhibition voltage Vin to the first to j-th bit lines BL1 to BLj according to the stored data. After the program operation starts, the first to j-th page buffers PB1 to PBj may apply the program permission voltage Val, the program decrease voltage Vde, or the program inhibition voltage yin to the first to j-th bit lines BL1 to BLj according to the stored data and the data sensed from the selected memory cells during the verify operation. The program permission voltage Val may be 0V, and the program decrease voltage Vde may be a positive voltage higher than the program permission voltage Val. The program inhibition voltage yin may be a positive voltage higher than the program decrease voltage Vde.

In the normal program method, the program permission voltage Val may be applied to the selected bit lines, and the program inhibition voltage Vin may be applied to the unselected bit lines. In the double program method, the program permission voltage Val may be applied to the first state bit lines, the program decrease voltage Vde may be applied to the second state bit lines, and the program inhibition voltage Vin may be applied to the unselected bit lines. Among them, the double program method is described as an example, and it is assumed that the first and second bit lines BL1 and BL2 are the first state bit lines, the third and fifth bit lines BL3 and BL5 are the second state bit lines, and the fourth and j-th bit lines BL4 and BLj are the unselected bit lines. In this case, the first and second page buffers PB1 and PB2 connected to the first and second bit lines BL1 and BL2 may output the program permission voltage Val, the third and fifth page buffers PB3 and PB5 connected to the third and fifth bit lines BL3 and BL5 may output the program decrease voltage Vde, and the fourth and j-th page buffers PB4 and PBj connected to the fourth and j-th bit lines BL4 and BLj may output the program inhibition voltage Vin. The voltages output from the first to j-th page buffers PB1 to PBj may vary according to the data sensed in the verify operation.

Figure 5:
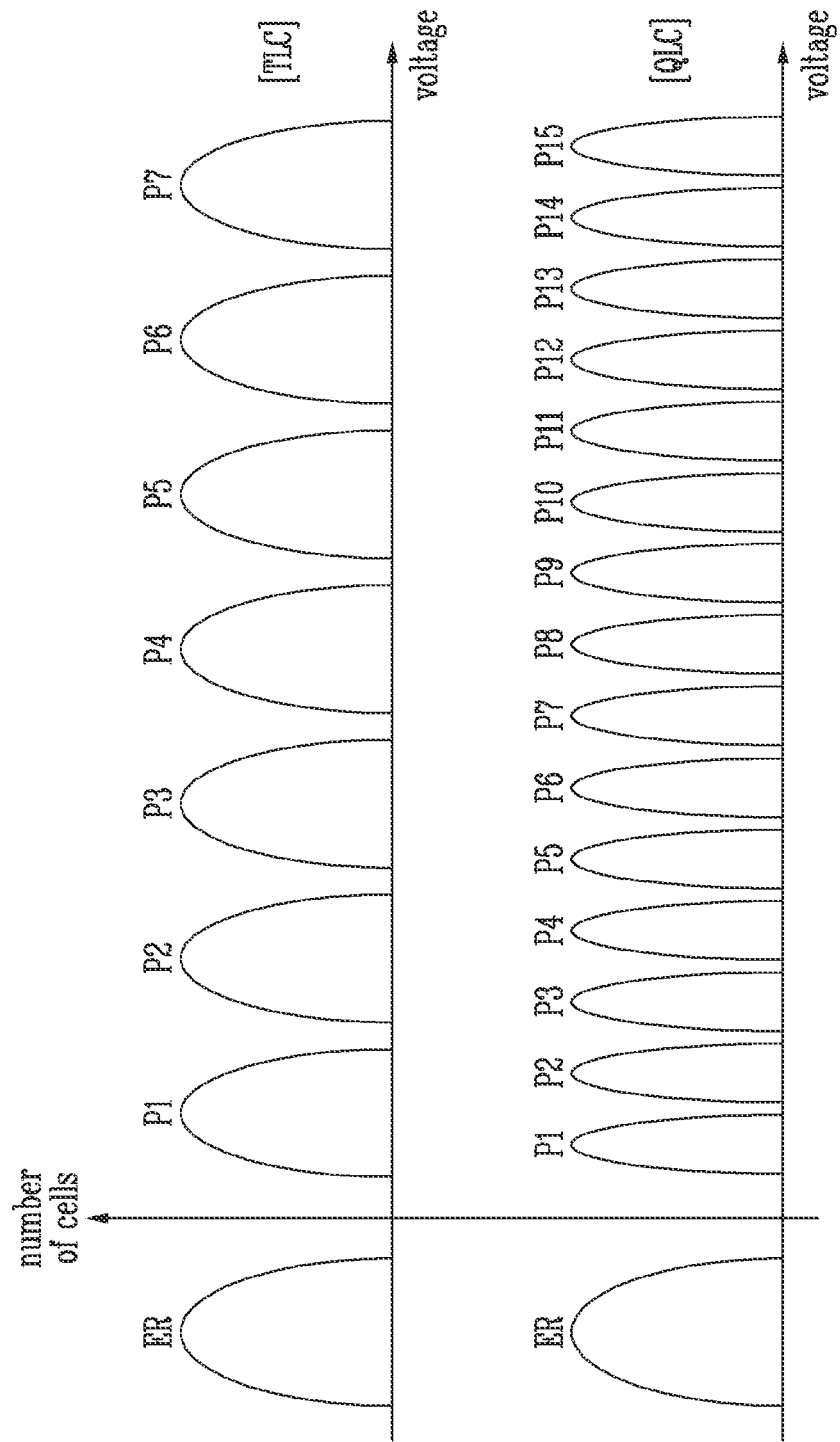
FIG. 5 is a diagram illustrating a threshold voltage distribution of memory cells.

FIG. 5 is a diagram illustrating a threshold voltage distribution of the memory cells.

Referring to FIG. 5, the program operation may be divided into various methods according to the number of bits stored in the memory cell. For example, a method of storing three bits of data in one memory cell is referred to as a triple level cell (TLC) method, and a method of storing four bits of data in one memory cell is referred to as a quadruple level cell (QLC) method.

In the TLC method, a state of the memory cells may be divided into any one of one erase state ER and seven program states P1 to P7. In the QLC method, the state of the memory cells may be divided into any one of one erase state ER and fifteen program states P1 to P15.

During the program operation, memory cells to be programmed to the first program state P1 may be programmed to have a target voltage corresponding to the first program state P1, and memory cells to be programmed to the second program state P2 may be programmed to have a target voltage corresponding to the second program state P2. In such a method, the remaining memory cells may be programmed to have a target voltage corresponding to each program state.

As the number of target voltages increases, an interval between threshold voltage distributions of the memory cells to be programmed to different program states decreases. Therefore, in the present embodiment, the normal program method and the double program method may be mixed.

FIC. 6A is a diagram illustrating the voltages applied to the bit lines in the normal program method. The y-axis represents the number of cells N# and the x-axis represents the voltage V.

Figure 6A:
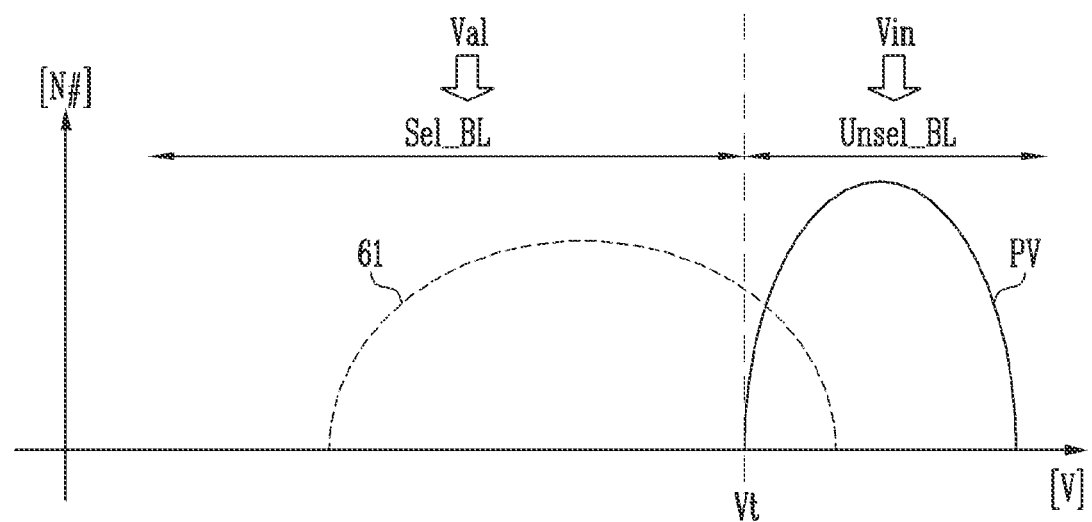
FIG. 6A is a diagram illustrating the voltages applied to the bit lines in a normal program method.

Referring to FIG. 6A, in the normal program method, one target verify voltage Vt may be set for each target voltage PV, and the selected memory cells may be programmed until a threshold voltage 61 is higher than the target verify voltage Vt.

During the program operation, the threshold voltage 61 of the selected memory cells may be increased each time the program voltage is applied, and the selected memory cells of which the threshold voltage is increased to the target voltage PV are changed to the unselected memory cells. Therefore, the program permission voltage Val may be applied to selected bit lines Sel_BL until the threshold voltage 61 of all selected memory cells reaches the target voltage PV, and the program inhibition voltage Vin may be applied to unselected bit lines Unsel_BL, For example, among the selected memory cells, bit lines connected to memory cells having a threshold voltage lower than the target verify voltage Vt may become the selected bit lines Sel_BL, and bit lines connected to memory cells having a threshold voltage equal to or greater than the target verify voltage Vt may become the unselected bit lines Unsel_BL.

Figure 6B:
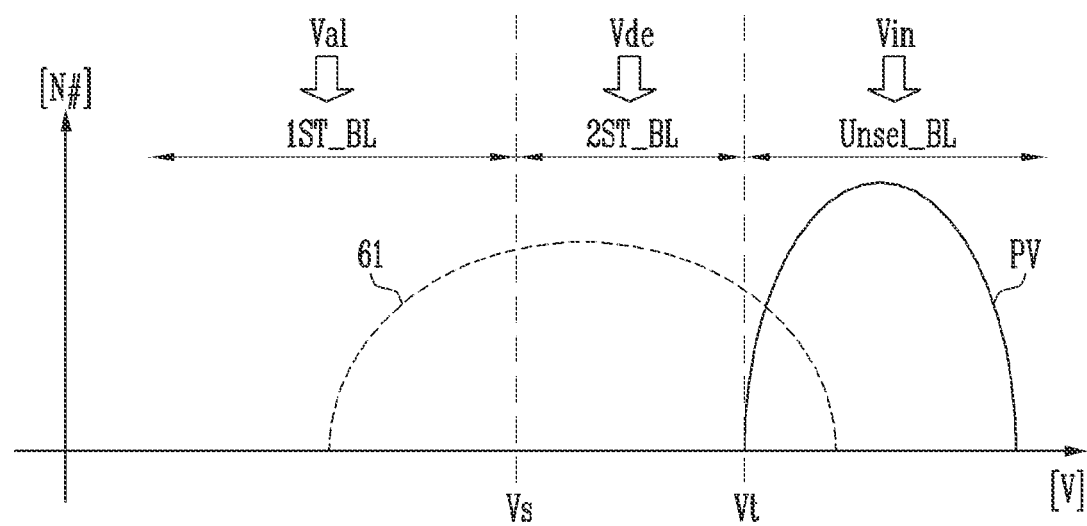
FIG. 6B is a diagram illustrating the voltages applied to the bit lines in a double program method.

FIG. 6B is a diagram illustrating the voltages applied to the bit lines in the double program method. The y-axis represents the number of cells N# and the x-axis represents the voltage V.

Referring to FIG. 6B, in the double program method, two or more verify voltages Vs and Vt may be set for each target voltage PV, and the selected memory cells may be programmed until the threshold voltage 61 is higher than the target verify voltage Vt. In the present embodiment, a program operation in which a sub verify voltage Vs and a target verify voltage Vt are used as the verify voltages is described. The sub verify voltage Vs may be set to a level lower than the target verify voltage Vt.

In the double program operation, after a sub verify operation using the sub verify voltage Vs is performed, a main verify operation using the target verify voltage Vt may be performed. Therefore, the selected memory cells may be divided into memory cells having a threshold voltage lower than the sub verify voltage Vs and memory cells having a threshold voltage between the sub verify voltage Vs and the target verify voltage Vt, and memory cells having a threshold voltage equal to or greater than the target verify voltage Vt according to a result of the sub verify operation and the main verify operation.

Bit lines connected to the memory cells having the threshold voltage lower than the sub verify voltage Vs may become first state bit lines 1ST_BL, bit lines connected to the memory cells having the threshold voltage between the sub verify voltage Vs and the target verify voltage Vt may become second state bit lines 2ST_BL, and bit lines connected to the memory cells having the threshold voltage equal to or greater than the target verify voltage Vt may become unselected bit lines Unsel_BL.

While the program operation is performed, the program permission voltage Val may be applied to the first state bit lines 1ST_BL, the program decrease voltage Vde may be applied to the second state bit lines 2ST_BL, and the program inhibition voltage yin may be applied to the unselected bit lines Unsel_BL, until all threshold voltages of the selected memory cells are increased to the target verify voltage Vt. When the program decrease voltage Vde between the program peg mission voltage Val and the program inhibition voltage yin is applied to the second state bit lines 2ST_BL, the threshold voltage of the memory cells connected to the second state bit lines 2ST_BL may increase slower than the threshold voltage of the memory cells to which the program permission voltage Val is applied. In other words, due to a difference between the program permission voltage Val and the program decrease voltage Vde, a threshold voltage change amount of the memory cells connected to the second state bit lines 2ST_BL is relatively less than a threshold voltage change amount of the memory cells connected to the first state bit lines 1ST_BL. Therefore, a phenomenon in which the threshold voltage of the memory cells connected to the second state bit lines 2ST_BL is excessively increased may be prevented.

However, in the program operation of the double program method, since the sub verify operation and the main verify operation are performed, a program operation time may increase. Therefore, in the present embodiment, the program operation of the double program may be selectively performed on selected memory cells having the highest target voltage PV. The program operation according to the present embodiment is described as follows.

FIG. 7 is a flowchart illustrating the program operation according to an embodiment of the present disclosure.

Referring to FIG. 7, when the program operation of the selected page starts, k (k is a positive integer) which is the number of program loops is set to 1 (S71), and a k-th program loop may be performed (S72). In the k-th program loop, the sub program operation of applying the program voltage to the selected word line and the verify operation of verifying the threshold voltage of the selected memory cells may be performed. The k-th program loop for programming the memory cells to first to (n−1)-th target voltages PV1 to PV(n−1) may be performed in a double program method DPGM, and the k-th program loop for programming the memory cells to an n-th target voltage PVn may be performed in a normal program method NPGM. For example, when k is 1, a first program loop may be performed, and in the first program loop, the sub program operation and the first verify operation for programming the memory cells to the first target voltage PV1 may be performed in the double program method DPGM. Subsequently, an operation for determining whether the threshold voltage of the memory cells is increased to the first to (n−1)-th target voltages PV1 to PV(n−1) may be performed (S73). When the threshold voltage of the memory cells is not increased to the first to (n−1)-th target voltages PV1 to PV(n−1) (NO), k is increased by 1 (S74), and an operation of increasing the program voltage Vpgm may be performed (S75). Subsequently, the k-th program loop using the increased program voltage Vpgm may be performed (S72).

Steps S71 to S75 may be repeated until all threshold voltages of the memory cells are increased to the first to (n−1)-th target voltages PV1 to PV(n−1). As steps S71 to S75 are repeated, the number of memory cells reaching a low target voltage among the first to (n−1)-th target voltages PV1 to PV(n−1) may increase. Therefore, when steps S71 to S75 are repeated, a program loop for the highest n-th target voltage may be performed.

In a state in which the verify operation for at least one of the first to (n−1)-th target voltages PV1 to PV(n−1) is faded in step S73, program loops for the target voltage lower than the n-th target voltage PVn may be performed in the double program method DPGM, and program loops for the n-th target voltage PVn may be performed in the normal program method NPGM in step S72. Since the program loops for the n-th target voltage PVn are performed in the normal program method NPGM, a program operation time of the selected page may be shortened.

In step S73, when it is determined that all threshold voltages of the memory cells are increased to the first to (n−1)-th target voltages PV1 to PV(n−1) (YES), k is increased by 1 for a next program loop (S76), the k-th program loop for the n-th target voltage PVn may be performed (S77). The k-th program loops for the n-th target voltage PVn performed from step S77 may be performed in the double program method DPGM.

Subsequently, an operation for determining whether the threshold voltage of the memory cells is increased to the n-th target voltage PVn may be performed (S78). When the threshold voltage of the memory cells is not increased to the n-th target voltage PVn (NO), k is increased by 1 (S79) and an operation of increasing the program voltage Vpgm may be performed (S80). Subsequently, the k-th program loop using the increased program voltage Vpgm may be performed (S77).

Steps S77 to S80 may be repeated until all threshold voltages of the memory cells are increased to the n-th target voltage PVn, and when all threshold voltages of the memory cells are increased to the n-th target voltage PVn (YES of S78), the program operation of the selected page may be ended.

Figure 8:
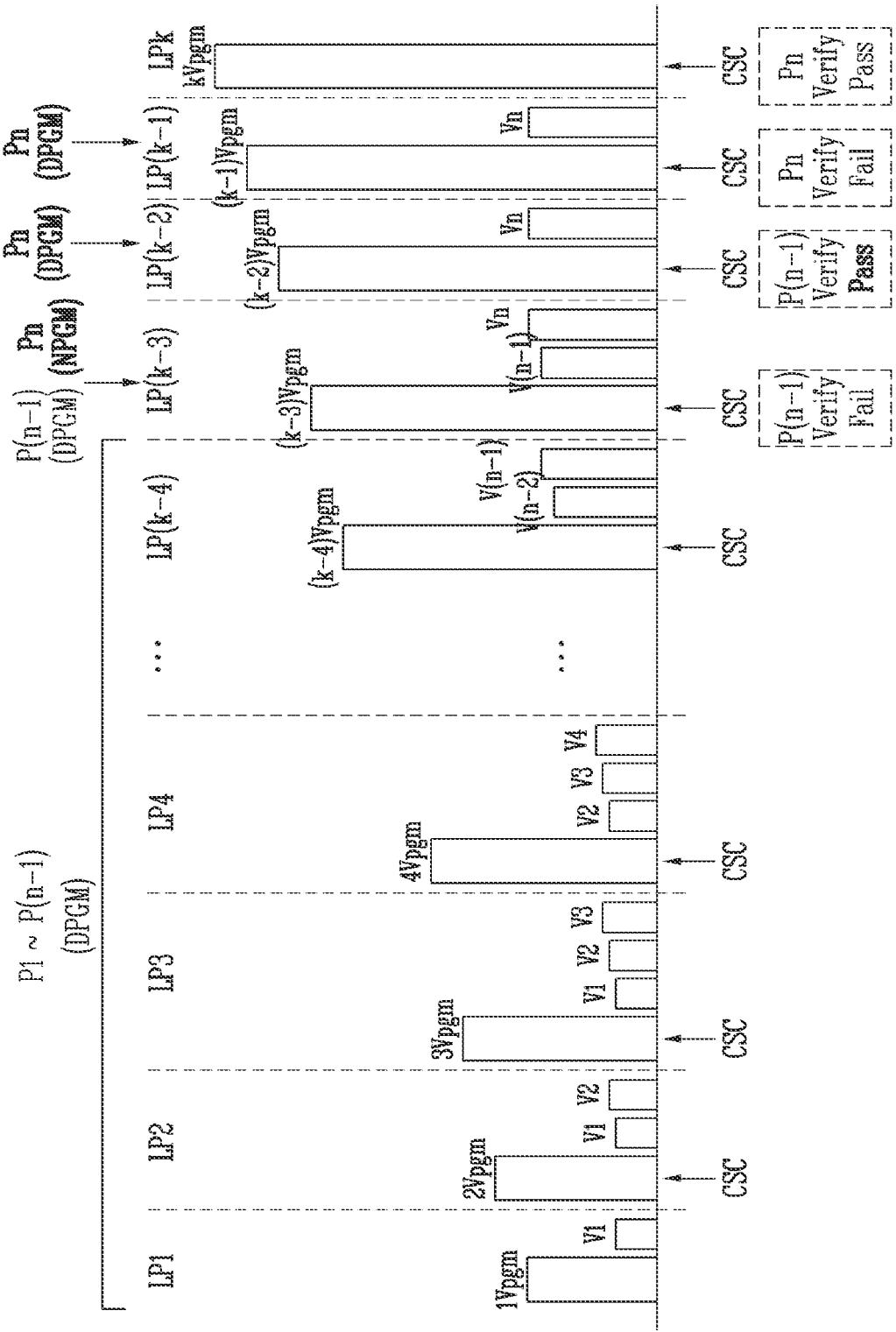
FIG. 8 is a diagram illustrating an embodiment of the present disclosure for each program loop.

FIG. 8 is a diagram illustrating an embodiment of the present disclosure for each program loop.

Referring to FIG. 8, a first program loop LP1 may be performed in the double program method DPGM. For example, in the first program loop LP1, a sub program operation using a first program voltage 1Vpgm and a verify operation using a first verify voltage V1 as the target voltage may be sequentially performed. Assuming that the first verify voltage V1 is the main verify voltage, the verify operation may further include a sub verify operation using a first sub verify voltage lower than the first verify voltage V1. For example, after the sub verify operation using the first sub verify voltage is performed, the main verify operation using the first verify voltage V1 may be performed.

Subsequently, a second program loop LP2 may be performed. The second program loop LP2 may be performed in the double program method DPGM. For example, in the second program loop LP2, a sub program operation using a second program voltage 2Vpgm higher than the first program voltage 1Vpgm may be performed. During the sub program operation, a current sensing check (CSC) operation for determining whether the verify operation performed in the first program loop LP1 is passed or failed may be performed. In the current sensing check CSC operation, when it is determined that the first verify operation is failed, in the second program loop LP2, first and second verify operations using first and second verify voltages V1 and V2 may be performed, Since the second program loop LP2 is performed in the double program method DPGM, the sub verify operation and the main verify operation may be performed in each of the first and second verify operations.

The third program loop LP3 may be performed in the double program method DPGM. For example, in the third program loop LP3, a sub program operation using a third program voltage 3Vpgm higher than the second program voltage 2Vpgm may be performed. During the sub program operation, a current sensing check CSC operation for determining whether the verify operations performed in the second program loop LP2 are passed or failed may be performed. When it is determined that both of the first and second verify operations are failed in the current sensing check CSC operation, in the third program loop LP3, first to third verify operations using first to third verify voltages V1 to V3 may be performed. Since the third program loop LP3 is performed in the double program method DPGM, the sub verify operation and the main verify operation may be performed in each of the first to third verify operations.

The fourth program loop LP4 may be performed in the double program method DPGM. For example, in the fourth program loop LP4, a sub program operation using a fourth program voltage 4Vpgm higher than the third program voltage 3Vpgm may be performed. During the sub program operation, a current sensing check CSC operation for determining whether the verify operations performed in the third program loop LP3 are passed or failed may be performed. In the current sensing check CSC operation, when it is determined that a first verify operation among first to third verify operations is passed and the second and third verify operations are failed, in the fourth program loop LP4, second to fourth verify operations using second to fourth verify voltages V2 to V4 may be performed. Since the fourth program loop LP4 is performed in the double program method DPGM, the sub verify operation and the main verify operation may be performed in each of the second to fourth verify operations, Fourth to (k−5)-th program loops LP4 to LP(k−5) may be performed in the above-described method.

A (k−4)-th program loop LP(k−4) may be performed in the double program method DPGM. For example, in the (k−4)-th program loop LP(k−4), a sub program operation using a (k−4)-th program voltage (k−4)Vpgm higher than a (k−5)-th program voltage (k−5)Vpgm may be performed. During the sub program operation, a current sensing check CSC operation for determining whether the verify operations performed in the (k−5)-th program loop LP(k−5) are passed or faded may be performed. The verify operation passed in the current sensing check CSC operation may be omitted from the (k−4)-th program loop LP(k−4). In the (k−4)-th program loop LP(k−4), (n−2)-th and (n−1)-th verify operations using (n−2)-th and (n−1)-th verify voltages V(n−2) and V(n−1) may be performed.

When a (k−3)-th program loop LP(k−3) starts, a sub program operation using a (k−3)-th program voltage (k−3)Vpgm higher than the (k−4)-th program voltage (k−4)Vpgm may be performed. During the sub program operation, a current sensing check CSC operation for determining whether the verify operations performed in the (k−4)-th program loop LP(k−4) are passed or failed may be determined. In the current sensing check CSC operation, when it is determined that an (n−2)-th verify operation is passed and the (n−1)-th verify operation is failed, the (n−2)-th verify operation may be omitted from the (k−3)-th program loop LP(k−3). When an n-th verify operation using an n-th verify voltage Vn is performed from the (k−3)-th program loop LP(k−3), the (n−1)-th verify operation may be performed in the double program method DPGM, and the n-th verify operation using the n-th verify voltage Pn may be performed in the normal program method NPGM. That is, since the (n−1)-th verify operation is failed, the n-th verify operation may be performed in the normal program method NPGM.

When a (k−2)-th program loop LP(k−2) starts, a sub program operation using a (k−2)-th program voltage (k−2)Vpgm higher than the (k−3)-th program voltage (k−3)Vpgm may be performed. During the sub program operation, a current sensing check CSC operation for determining whether the verify operations performed in the (k−3)-th program loop LP(k−3) are passed or failed may be determined. In the current sensing check CSC operation, when it is determined that the (n−1)-th verify operation is passed and the n-th verify operation is failed, the (n−1)-th verify operation may be omitted from the (k−2)-th program loop LP(k−2). Since the (n−1)-th verify operation is passed, the n-th verify operation using the n-th verify voltage Vn may be performed in the double program method DPGM.

When a (k−1)-th program loop LP(k−1) starts, a sub program operation using a (k−1)-th program voltage (k−1)Vpgm higher than the (k−2)-th program voltage (k−2)Vpgm may be performed. During the sub program operation, a current sensing check CSC operation for determining whether the verify operation performed in the (k−2)-th program loop LP(k−2) is passed or failed may be determined. In the current sensing check CSC operation, when it is determined that the n-th verify operation is failed, a k-th program loop LPk may be performed after the n-th verify operation is performed.

When the k-th program loop LPk starts, a sub program operation using a k-th program voltage kVpgm higher than the (k−1)-th program voltage (k−1)Vpgm may be performed. During the sub program operation, a current sensing check CSC operation for determining whether the verify operation performed in the (k−1)-th program loop LP(k−1) is passed or failed may be performed. In the current sensing check CSC operation, when it is determined that the n-th verify operation is passed, the program operation of the selected page may be ended.

Since the above-described program operation is an embodiment for helping understanding of the present embodiment, the verify operations performed in each of the program loops and the verify voltages may vary according to the memory device.

According to the above-described present embodiment, until the (n−1)-th verify operation is passed, all of the first to (n−1)-th verify operations except for the n-th verify operation may be performed in the double program method DPGM and only the n-th verify operation may be performed in the normal program method. The n-th verify operation may be performed in the double program method DPGM after the (n−1)-th verify operation is passed.

Therefore, the program operation time may be shortened by performing the n-th verify operation in the normal program method NPGM until the (n−1)-th verify operation is passed. In addition, a threshold voltage distribution of the memory cells programmed to have the n-th target voltage may be improved by performing the n-th verify operation in the double program method DPGM after the n-th verify operation is passed.

Figure 9:
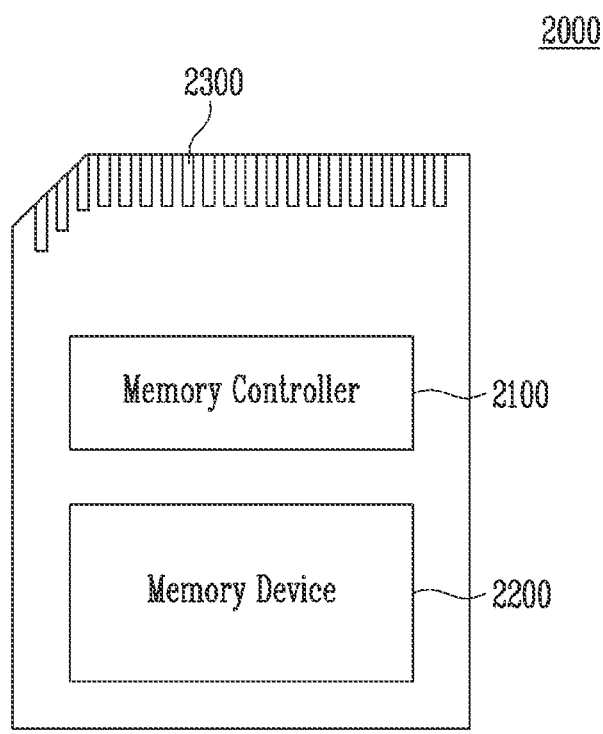
FIG. 9 is a diagram illustrating a memory card system to which the memory device of the present disclosure is applied.

FIG. 9 is a diagram illustrating a memory card system to which the memory device of the present disclosure is applied.

Referring to FIG. 9, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control a program, read, or erase operation of the memory device 2200 or control a background operation. The memory controller 2100 is configured to provide an interface between the memory device 2200 and a host. The memory controller 2100 is configured to drive firmware for controlling the memory device 2200. The memory device 2200 may be configured identically to the memory device MD described with reference to FIG. 2.

The memory controller 2100 may communicate with an external device through the connector 2300, The memory controller 2100 may communicate with the external device (for example, the host) according to a specific communication standard. For example, the memory controller 2100 is configured to communicate with the external device through at least one of various communication standards such as a universal serial bus (USB), a multimedia card (MMC), an embedded MMC (eMMC), peripheral component interconnection (PCI), PCI-express (PCI-E), advanced technology attachment (ATA), serial-ATA, parallel-ATA, a small computer system interface (SCSI), an enhanced small disk interface (ESDI), integrated drive electronics (IDE), firewire, a universal flash storage (UFS), WIFI, Bluetooth, and NVMe. For example, the connector 2300 may be defined by at least one of the various communication standards described above.

For example, the memory device 2200 may be configured of various non-volatile memory devices such as an electrically erasable and programmable ROM (EEPROM), a NAND flash memory, a NOR flash memory, a phase-change RAM (PRAM), a resistive RAM (ReRAM), ferroelectric RAM (FRAM), and a spin transfer torque-magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 10:
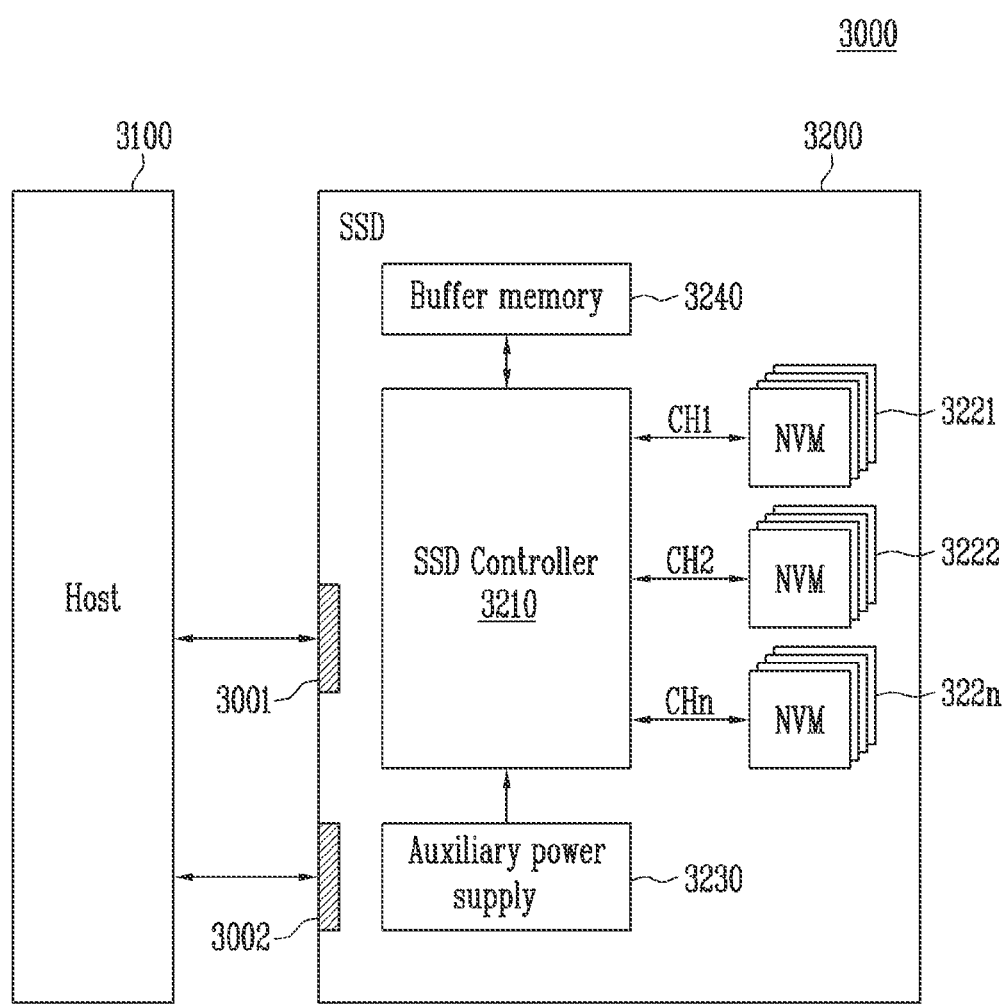
FIG. 10 is a diagram illustrating a solid state drive (SSD) system to which the memory device of the present disclosure is applied.

FIG. 10 is a diagram illustrating a solid state drive (SSD) system to which the memory device of the present disclosure is applied.

Referring to FIG. 10, the SSD system 3000 includes a host 3100 and an SSD 3200. The SSD 3200 exchanges a signal with the host 3100 through a signal connector 3001 and receives power through a power connector 3002. The SSD 3200 includes an SSD controller 3210, a plurality of flash memories 3221 to 322n, an auxiliary power supply device 3230, and a buffer memory 3240.

According to an embodiment of the present disclosure, the flash memories 3221 to 322n may be configured identically to the memory device MD described with reference to FIG. 2.

The SSD controller 3210 may control the plurality of flash memories 3221 to 322n in response to the signal received from the host 3100. For example, the signal may be signals based on an interface between the host 3100 and the SSD 3200. For example, the signal may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Ali-Fi, Bluetooth, and an NVMe.

The auxiliary power supply device 3230 is connected to the host 3100 through the power connector 3002. The auxiliary power supply device 3230 may receive the power from the host 3100 and may charge the power. The auxiliary power supply device 3230 may provide power of the SSD 3200 when power supply from the host 3100 is not smooth. For example, the auxiliary power supply device 3230 may be positioned in the SSD 3200 or may be positioned outside the SSD 3200. For example, the auxiliary power device supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, and an LPDDR SDRAM, or non-volatile memories such as an FRAM, a ReRAM, an STT-MRAM, and a PRAM.

What is claimed is:

1. A memory device comprising:
   a memory block including a plurality of pages;
   a peripheral circuit configured to perform a program operation to program memory cells included in a page selected among the plurality of pages to first to N-th program states, wherein 'N' is an integer greater than or equal to 2; and
   a control logic circuit configured to control the peripheral circuit so that the program operation is performed,
   wherein the peripheral circuit comprises page buffers connected to the memory block through bit lines,
   wherein the control logic circuit controls the peripheral circuit so that memory cells to be programmed to first to (N−1)-th program states are programmed with a double program method using a main verify voltage and a sub verify voltage less than the main verify voltage during a verify operation and memory cells to be programmed to the N-th program state are programmed in a normal program method using the main verify voltage during the verify operation, when the verify operation of the memory cells corresponding to the (N−1)-th program state has failed,
   wherein the control logic circuit controls the peripheral circuit so that the verify operation of the memory cells to be programmed to the N-th program state is performed with the double program method when the verify operation of the memory cells corresponding to the (N−1)-th program state has passed, and
   wherein the page buffers included in the peripheral circuit are configured to apply a program permission voltage to selected bit lines connected to memory cells having a threshold voltage less than the main verify voltage among the bit lines and apply a program inhibition voltage to unselected bit lines connected to memory cells having a threshold voltage equal to or greater than the main verify voltage among the bit lines, in the normal program method.

2. The memory device of claim 1, wherein the peripheral circuit comprises:
   a voltage generator configured to generate voltages required for the program operation and the verify operation; and
   a row decoder configured to transfer the voltages generated by the voltage generator to the memory block.

3. The memory device of claim 1,
   wherein the page buffers are configured to apply the program permission voltage to first state bit lines connected to memory cells having a threshold voltage less than the sub verify voltage among the bit lines, apply a program decrease voltage to second state bit lines connected to memory cells having a threshold voltage between the sub verify voltage and the main verify voltage among the bit lines, and apply the program inhibition voltage to the unselected bit lines connected to the memory cells having the threshold voltage equal to or greater than the main verify voltage among the bit lines, in the double program method.

4. The memory device of claim 3,
   wherein the program decrease voltage is set to a positive voltage greater than the program permission voltage, and the program inhibition voltage is set to a positive voltage greater than the program decrease voltage.

5. The memory device of claim 1,
   wherein the control logic circuit controls the peripheral circuit so that a plurality of program loops in which a program voltage is increased are performed during the program operation.

6. A method of operating a memory device in a program operation for programming memory cells to first to N-th program states, wherein 'N' is an integer greater than or equal to 2, the method comprising:
   performing a sub program operation, a sub verify operation, and a main verify operation on memory cells to be programmed to the first to (N−1)-th program states, and performing the sub program operation and the main verify operation on memory cells to be programmed to the N-th program state; and
   performing the sub program operation, the sub verify operation, and the main verify operation on the memory cells to be programmed to the N-th program state when the main verify operation of the memory cells to be programmed to the (N−1)-th program state has passed,
   wherein in the main verify operation, a program permission voltage is applied to bit lines connected to memory cells sensed with a threshold voltage less than a main verify voltage, and a program inhibition voltage is applied to bit lines connected to memory cells sensed with a threshold voltage equal to or greater than the main verify voltage.

7. The method of claim 6, wherein in performing the sub program operation and the main verify operation on the memory cells to be programmed to the N-th program state,
the sub program operation is performed with a method of applying a program voltage to a selected word line connected to the memory cells, and
the main verify operation is performed with a method of sensing a threshold voltage of the memory cells using the main verify voltage.

8. The method of claim 7,
wherein the main verify voltage is set to a voltage for determining whether the threshold voltage of the memory cells reaches a target voltage.

9. The method of claim 6, wherein in performing the sub program operation, the sub verify operation, and the main verify operation on the memory cells to be programmed to the N-th program state,
the sub program operation is performed with a method of applying a program voltage to a selected word line connected to the memory cells,
the sub verify operation is performed with a method of sensing a threshold voltage of the memory cells using a sub verify voltage, and
the main verify operation is performed with a method of sensing the threshold voltage of the memory cells using the main verify voltage greater than the sub verify voltage.

10. The method of claim 9,
wherein in the main verify operation, the program permission voltage is applied to bit lines connected to memory cells sensed with a threshold voltage less than the sub verify voltage, a program decrease voltage is applied to bit lines connected to memory cells having a threshold voltage between the sub verify voltage and the main verify voltage, and the program inhibition voltage is applied to the bit lines connected to the memory cells sensed with the threshold voltage equal to or greater than the main verify voltage.

11. The method of claim 10,
wherein the program decrease voltage is greater than the program permission voltage, and the program inhibition voltage is less than the program decrease voltage.

12. The method of claim 6, further comprising:
performing a current sensing check operation for determining a result of the main verify operation.

13. The method of claim 12,
wherein the current sensing check operation is performed when the sub program operation is performed.

14. A method of operating a memory device, the method comprising:
programming memory cells to first to N-th program states according to a target voltage, and performing program loops by mixing a normal program method and a double program method until a program operation of memory cells of which the target voltage corresponds to an (N−1)-th program state is completed, wherein 'N' is an integer greater than or equal to 2; and
performing the program loops in the double program method after the program operation of the memory cells of which the target voltage corresponds to the (N−1)-th program state has completed,
wherein in the normal program method, a program permission voltage is applied to selected bit lines connected to memory cells having a threshold voltage less than a main verify voltage, and a program inhibition voltage is applied to unselected bit lines connected to memory cells having a threshold voltage equal to or greater than the main verify voltage.

15. The method of claim 14, wherein the normal program method comprises:
performing a sub program operation of applying a program voltage to a word line connected to the memory cells; and
performing a verify operation of sensing the memory cells using a main verify operation to determine whether a threshold voltage of the memory cells is increased to the target voltage.

16. The method of claim 14, wherein the double program method comprises:
performing a sub program operation of applying a program voltage to a word line connected to the memory cells;
performing a verify operation of sensing the memory cells using a sub verify operation to determine whether the threshold voltage of the memory cells is increased to a sub target voltage lower than the target voltage; and
performing a verify operation of sensing the memory cells using a main verify operation to determine whether the threshold voltage of the memory cells is increased to the target voltage.

\* \* \* \* \*